United States Patent
Tabei

[19]

[11] Patent Number: 6,167,530
[45] Date of Patent: *Dec. 26, 2000

[54] DIGITAL AUDIO DATA ACCUMULATION DEVICE

[75] Inventor: Kazuhiko Tabei, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/660,416

[22] Filed: Jun. 7, 1996

[30] Foreign Application Priority Data

Jun. 7, 1995 [JP] Japan ...................................... 7-139784

[51] Int. Cl.$^7$ ............................. H02H 3/05; H03K 19/003
[52] U.S. Cl. ................................................ 714/8; 714/710
[58] Field of Search .............................. 395/182.06, 404; 369/54, 58–60; 364/DIG. 1; 365/200, 201; 371/10.2, 10.3; 714/8, 710, 711, 712

[56] References Cited

U.S. PATENT DOCUMENTS

| | | | |
|---|---|---|---|
| 4,498,146 | 2/1985 | Martinez ...................................... | 714/8 |
| 4,577,319 | 3/1986 | Takeuchi et al. ....................... | 371/40.3 |
| 4,688,202 | 8/1987 | Mukai et al. .............................. | 369/44 |
| 4,802,169 | 1/1989 | Suzuki et al. ........................... | 371/37.2 |
| 4,914,620 | 4/1990 | Kihara et al. ............................ | 395/402 |
| 5,105,427 | 4/1992 | Ando ...................................... | 371/40.1 |
| 5,228,041 | 7/1993 | Yoshino et al. ......................... | 371/47.1 |
| 5,241,531 | 8/1993 | Ohno et al. .......................... | 369/275.2 |
| 5,331,617 | 7/1994 | Fuma et al. ............................... | 369/54 |
| 5,410,526 | 4/1995 | Maeda et al. .............................. | 369/48 |
| 5,539,586 | 7/1996 | Inoue et al. ............................. | 360/19.1 |
| 5,559,779 | 9/1996 | Iizuka ....................................... | 369/59 |
| 5,596,564 | 1/1997 | Fukushima et al. ................. | 369/275.3 |

FOREIGN PATENT DOCUMENTS

| | | | |
|---|---|---|---|
| 5-204400 | 8/1993 | Japan . | |
| 5204400 | 8/1993 | Japan .............................. | G10L 9/18 |
| 5257500 | 10/1993 | Japan .............................. | G10L 9/18 |

*Primary Examiner*—Dieu-Minh T. Le
*Attorney, Agent, or Firm*—Sughrue, Mion, Zinn, Macpeak & Seas, PLLC

[57] ABSTRACT

A system control unit of a digital audio data accumulation device detects faulty storage portion per a predetermined unit in an audio storage device and a faulty address table is sequentially generated from the leading address of the audio storage device on the basis of a result of detection. The system control unit stores an input digital compression signal from an audio compression/decompression device in said audio storage device while avoiding faulty storage portion by making reference to the faulty address table. The system control unit reads out an output audio digital compressed signal from the audio storage device while avoiding faulty storage portion by making reference to the faulty address table.

14 Claims, 16 Drawing Sheets

FIG.2

| ADDRESS (DECIMAL) | 0 | 1 | 2 | 3 | 4 | 5 | 6 | 7 | |
|---|---|---|---|---|---|---|---|---|---|
| 0 | | | | X | | | | X | FAULTY WORD |
| 1 | | | | | | | | | |
| 2 | | | | | X | | | | FAULTY WORD |
| 3 | | | | | | | | | |
| 4 | | | | | | | | | |
| 5 | | | | | | | | | |
| 6 | | | | | | | | | |
| 7 | | X | | X | | | X | | FAULTY WORD |
| 8 | | | | | | | X | | FAULTY WORD |
| 9 | | | | | | | | | |
| 10 | | | | | | | | | |
| 11 | | | | | | | | | |
| 12 | | | | | | | | | |
| 13 | | | | | | | | | |
| 14 | | | | | | | | | |
| 15 | | | | | | X | | | FAULTY WORD |
| 16 | | | | | | | | | |
| 17 | X | | | | | | | | FAULTY WORD |
| 18 | | | | | | | | | |
| 19 | | | | | | | | | |
| 20 | | | | | | | | | |
| 21 | | | | | | | | | |
| 22 | | | | | | | | | |
| 23 | | | | | | | | | |
| 24 | | | | | | | | | |
| 25 | | | | | | | | | |
| 26 | | | | | | | | | |
| 27 | | | | | | | | | |
| 28 | | | | | | | | | |
| 29 | | | X | | | X | | | FAULTY WORD |
| 30 | | | | | | | | | |
| ... | | | | | | | | | |
| 253 | | | | | | | | | |
| 254 | | | | | | | | | |
| 255 | | | | | | | | | |

8 BITS

FIG. 3

| Address | CONTENTS OF STORED DATA | |
|---|---|---|
| 0 | FAULTY WORD | |
| 1 | NON-USED NORMAL WORD | |
| 2 | FAULTY WORD | |
| 3 | 0 3 | START ADDRESS VALUE OF NORMAL REGION #1 |
| 4 | 0 3 | END ADDRESS VALUE OF NORMAL REGION #1 |
| 5 | 0 9 | STORAGE POSITION OF START ADDRESS VALUE OF NORMAL REGION #2 |
| 6 | NON-USED NORMAL WORD | |
| 7 | FAULTY WORD | |
| 8 | FAULTY WORD | |
| 9 | 0 9 | START ADDRESS VALUE OF NORMAL REGION #2 |
| 10 | 1 2 | END ADDRESS VALUE OF NORMAL REGION #2 |
| 11 | 1 2 | STORAGE POSITION OF START ADDRESS VALUE OF NORMAL REGION #3 |
| 12 | 1 8 | START ADDRESS VALUE OF NORMAL REGION #3 |
| 13 | 2 4 | END ADDRESS VALUE OF NORMAL REGION #3 |
| 14 | 1 8 | STORAGE POSITION OF START ADDRESS VALUE OF NORMAL REGION #4 |
| 15 | FAULTY WORD | |
| 16 | NON-USED NORMAL WORD | |
| 17 | FAULTY WORD | |
| 18 | 3 0 | START ADDRESS VALUE OF NORMAL REGION #4 |
| 19 | 2 5 2 | END ADDRESS VALUE OF NORMAL REGION #4 |
| 20 | 0 0 | "00" INDICATES END OF FAULTY ADDRESS TABLE |
| 21 | | |
| 22 | | |
| 23 | | |
| 24 | | |
| 25 | | |
| 26 | | |
| 27 | NON-USED NORMAL WORD | |
| 28 | NON-USED NORMAL WORD | |
| 29 | FAULTY WORD | |
| 30 | | |
| ... | | |
| 253 | | |
| 254 | | |
| 255 | NON-USED NORMAL WORD | |

Rows 3–5: NORMAL REGION #1
Rows 9–14: NORMAL REGION #2
Rows 21–26: NORMAL REGION #3
Rows 30–254: NORMAL REGION #4

Rows 0–20: FAULTY ADDRESS TABLE REGION
Rows 21–255: AUDIO DATA STORAGE REGION

DIGITAL AUDIO DATA ACCUMULATION DEVICE

BACKGROUND OF THE INVENTION

1. Field of the Invention

The present invention relates generally to a digital audio data accumulation device. More specifically, the invention relates to a digital audio data accumulation device for recording and reproducing a digital audio data in and from an audio data storage system having a faulty storage portion.

2. Description of the Related Art

Conventionally, in order to accumulate digital audio data in a digital audio data accumulation device, there is a system which records and reproduce audio data in and from an audio data storage system having a sequence of normal storage portions from a leading address while avoiding a faulty storage portion, as illustrated in FIG. 16.

This method restricts in the audio storage device by requiring of sequential normal storage region from the leading address. In this method, the audio data is stored in the storage region subsequent to the sequential normal storage region from the leading address and up to the trailing end. Recording of the audio data can be performed even when a faulty storage region is present in the storage region for the audio data.

In the accumulating method of the digital audio data as set forth above, the audio storage region including the faulty storage region is divided into equal size sub-regions for managing each sub-regions individually. Namely, in the sequence of normal storage region from the known leading address (address 0) (storage region from address 0 to address n: segment table), a faulty address table is generated.

In such audio recording device, the audio storage region [storage region of address (n+1) and subsequent storage region] including faulty storage portion [storage region of address (n+201) to address (n+300)] is divided into n in number of sub-regions to be managed per sub-region. With respect to each of the divided sub-regions, faulty inspection is performed. The result of faulty inspection is stored in the faulty address table. It should be noted that the sub-regions which can be used and the sub-regions which cannot be used are determined depending upon presence or absence of the faulty bit in the audio storage device.

The faulty sub-region has significant influence particularly for compressed audio coded data. In the extreme case, it is heard as noise. Therefore, by setting an error flag (ERROR FLAG), the use of the faulty sub-region is prohibited.

For example, since segment region 1 from address (n+1) to address (n+100) can be used, the error flag of the segment 1 in the segment table is set to OFF. Also, since the segment region 2 from address (n+101) to address (n+200) can be used, the error flag of the segment 2 in the segment table is also set OFF.

In contrast to this, since the segment region 3 from address (n+201) to address (n+300) cannot be used, the error flag of the segment 3 in the segment table is set to ON.

When the audio data is stored in the audio storage device, or when the audio data is read out from the audio storage device, reference is made to the faulty address table corresponding to the respective of the abovementioned sub-regions so that storing and reading out for the audio storage device is performed according to the result of the reference made.

As the device for accumulating audio data, in the consumer field which is a particularly large market, the audio accumulation device employing a tape as a storage medium is built in an automatic-answering and recording telephone, or a voice memo device, and so forth.

However, in the frequently used application, such as in the consumer field, a problem may arise in maintenance or durability of the data audio recording apparatus, or in operability (response speed and so forth).

Therefore, the digital audio data accumulation device utilizing audio data compressing and decompressing technology implemented in a semiconductor chip is becoming a built-in device in the equipments in the consumer field. In particular, with the tendency of decreasing of cost per bit of the audio storage device of the semiconductor chip, it is becoming possible to realize low cost of the digital audio data accumulation device.

In such case, application of the audio storage device having certain amount of faulty storage portion in the audio data storage system by commercialization thereof, significantly contributes to the lowering of cost per bit of the audio storage device. The semiconductor audio storage device including faulty storage portion is normally the faulty product in the semiconductor fabricating process to be disposed. By application of such semiconductor audio storage device including faulty storage portion to the audio storage device, a cost for disposing of such faulty product becomes zero and, more beneficially, by commercialization of such faulty products, the cost becomes approximately half to one third of the normal audio storage device having no faulty storage portion.

In the conventional digital audio data accumulation device as set forth above, there is a constraint to have sequence of normal region from the leading address to limit number of audio storage devices of the faulty semiconductor products to pass preliminary inspection. Such limitation of number of the faulty semiconductor products to be used as the audio storage device should cause a problem in supply amount as consumer use product.

SUMMARY OF THE INVENTION

Therefore, the present invention has been worked out for solving the problems set forth above. An object of the present invention is to provide a digital audio data accumulation device which can be supplied in large amount for consumer market.

According to a first aspect of the invention, an audio data accumulating device comprises:

audio data storage means for storing an audio data;

detecting means for sequentially detecting faulty storage regions in the audio data storage means from the leading address;

table generating means for writing normal region range information indicative of a range of normal region other than the faulty storage regions detected by the detecting means, in a part of the normal region of the audio data storage means as a faulty address table; and writing means for writing the audio data in the audio data storage means while avoiding the faulty storage region by making reference to the faulty address table.

According to the second aspect of the invention, an audio data accumulating device writing an audio data in audio data storage means with compression and reproducing the stored audio data by reading out from the audio data storage means has, the audio data storage means which comprises:

data storage region for storing the audio data, and a pointer region for storing a faulty storage region pointer indicative of faulty portion of the audio data storage portion; and writing means for writing the audio data in the audio data storage means while avoiding the faulty portion by making reference to the pointer region.

According to a third aspect of the invention, a data storage system comprises:

data storage means for storing a data;

detecting means for sequentially detecting faulty storage regions in the data storage means from the leading address;

table generating means for writing normal region range information indicative of a range of normal region other than the faulty storage regions detected by the detecting means, in a part of the normal region of the audio data storage means as a faulty address table; and writing means for writing the data in the data storage means while avoiding the faulty storage region by making reference to the faulty address table.

According to a fourth aspect of the invention, a data accumulating device writing a data in data storage means with compression and reproducing the stored data by reading out from the data storage means, has the data storage means which comprises:

data storage region for storing the data, and a pointer region for storing a faulty storage region pointer indicative of faulty portion of the data storage portion; and writing means for writing the data in the data storage means while avoiding the faulty portion by making reference to the pointer region.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIG. 2 is an illustration showing an example of construction before detection of faulty address of the audio data storage system of FIG. 1;

FIG. 3 is an illustration showing an example of construction after detection of faulty address of the audio data storage system of FIG. 1;

DESCRIPTION OF THE PREFERRED EMBODIMENT

The preferred embodiment of an audio data storage system according to the present invention will be discussed with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order not to unnecessary obscure the present invention.

Figure 1:
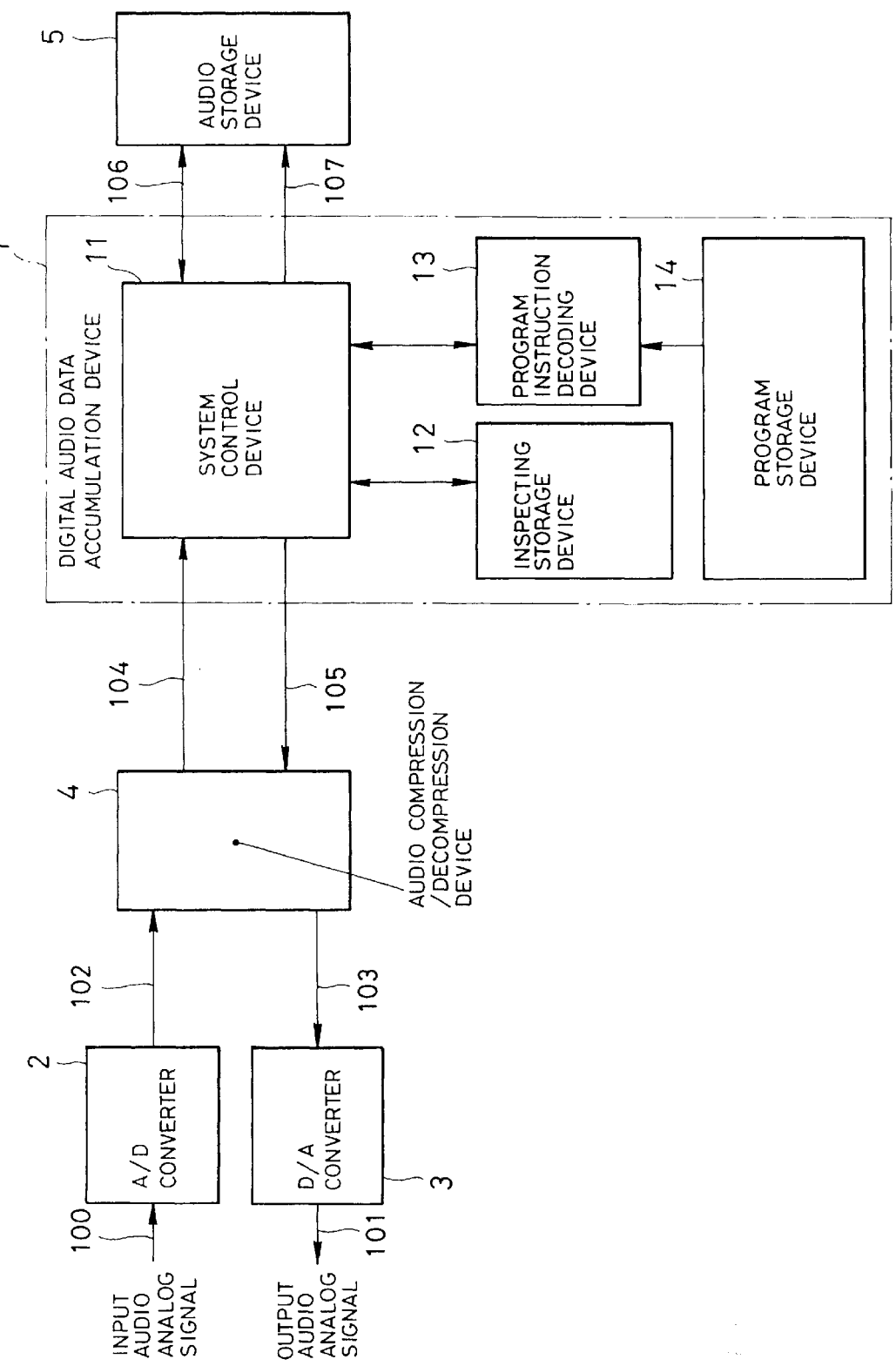
FIG. 1 is a block diagram showing a construction of one embodiment of an audio data storage system according to the present invention.

FIG. 1 is a block diagram showing a construction of one embodiment of an audio data storage system according to the present invention. In FIG. 1, one embodiment of the audio data storage system for consumer market according to the invention is constructed with a digital audio data accumulation device 1, an analog-to-digital (A/D) converter 2, a digital-to-analog (D/A) converter 3, an audio compression/decompression device 4 and an audio storage device 5.

An externally input audio analog signal 100 is converted into an input audio digital signal 102 and then input to an audio compression/decompression device 4. The audio compression/decompression device 4 compresses the input audio digital signal to feed an input audio digital compressed signal 104 to the digital audio data accumulation device 1.

The digital audio data accumulation device 1 is responsive to input of the input audio digital compressed signal 104 from the audio compression/decompression device 4 to output a bidirectional data bus signal 106 and an audio storage device control signal 107 to an audio storage device 5 to record the input audio digital compressed signal 104 in the audio storage device 5.

On the other hand, when the digital audio data accumulation device 1 reads out the audio data as the bidirectional data bus signal 106 from the audio storage device 5 by external command, the audio data is output from the digital audio data accumulation device 1 to the audio compression/decompression device 4 as an output audio digital compressed signal 105.

The audio compression/decompression device 4 performs decompression of the output audio digital compressed signal 105 from the digital audio data accumulation device 1 and output to the D/A converter 3 as an output audio digital signal 103. The D/A converter 3 converts the output audio digital signal 103 into an output audio analog signal 101 to output.

Here, the digital audio data accumulation device 1 is constructed with a system control unit 11, a storage device 12 for an inspecting operation, a program instruction decoding device 13 and a program storage device 14.

While not shown, the storage device 12 for inspecting operation is constructed with buffers #0 to #8 (buf0 to buf8), a pointer (adr, adr0) and a counter (count), in these buffers #0 to #8, the pointer and counter, data is stored.

Namely, in the buffer #0, an address value indicative of a position of a normal word located at leading end in the audio storage device is stored. In the buffer #1, a start address of a sequential normal region in detected one zone is stored. In the buffer #2, an end address of a sequential normal region in detected one zone is stored. In the buffer #3, an address indicative of the position to be written in a start/end value of the sequential normal region in the next detected one zone is stored.

On the other hand, in the buffer 4, an address value indicative of the position of a first word of sequentially written three words when the buffers #1 to #3 are written as three sequential words. In the buffer #5, a start address value of the faulty address table (utilizing the already inspected table) to be made reference to upon writing the faulty address table (not shown) of the buffers #1 to #3 is stored.

In the buffer #6, an end address value of the faulty address table to be made reference to upon writing the faulty address of the buffers #1 to #3 is stored. In the buffer #7, an address value to be used upon reading the values of the buffers #5 and #6 is stored. In the buffer #8, data read from the audio storage device 5 in order to compare with an inspection data written in the audio storage device upon faulty inspection is stored.

Furthermore, in the pointer, an address data to be output from the digital audio data accumulation device 1 to the audio storage device 5 is stored. The counter is a counter for loop on the program.

The program storage device 14 stores programs for performing data transmitting and receiving operation between the digital audio data accumulation device 1 and the audio compression/decompression device 4, or between the digital audio data accumulation device 1 and the audio storage device 5 and inspecting operation of the faulty storage portion included in the audio storage device 5.

The program stored in the program storage device 14 is read out from the program storage device 14 to the program instruction decoding device 13 and decoded therein. The result of decoding is fed to the system control unit 11 as a control signal to the program instruction decoding device 13. The system control unit 11 performs operation according to the control signal from the program decoding device 13.

In the program storage device 14, there are stored programs for realizing generally three functions: a faulty address detecting function, an audio recording function and a reproducing function.

The faulty address detecting function is adapted to detect address of the faulty storage portion within the audio storage device 5 for generating the faulty address table (not shown) from the leading address of the storage device 5 on the basis of the result of inspection. At this time, even when the faulty storage portion begins from the leading address of the audio storage device 5, the faulty address table generation process can be performed while avoiding the faulty storage portion.

In the recording function, the digital audio data accumulation device 1 receives the input audio digital compressed signal 104 from the audio compression/decompression device 4 and outputs to the audio storage device 5 as the bidirectional data bus signal. In conjunction therewith, the digital audio data accumulation device 1 outputs the audio storage device control signal 107 for controlling storing process in the audio storage device 5. In this case, the recording function is performed for storing the input audio digital compressed signal 104 from the audio compression/decompression device 4 in the audio storage device 5 while avoiding the faulty storage portion by making reference to the faulty address table generated by the faulty address detecting function.

The reproducing function is used when the digital audio data accumulation device 1 reads out the stored audio data from the audio storage device 5 as the bidirectional data bus signal 106 in response to the audio storage device control signal 107 and outputs the output audio data compressed signal 105 to the audio compression/decompression device 4. In this case, the reproducing function is performed for reading output audio digital compressed signal from the audio storage device 5 while avoiding the faulty storage portion of the audio storage device 5 by making reference to the faulty address table generated by the faulty address detecting function.

The digital audio data accumulation device 1 is responsive to a faulty address detection command from an external host to perform the faulty address detecting function, responsive to the recording command from the external host to perform recording function, and responsive to the reproduction command from the external host to perform reproducing function.

FIG. 2 is an illustration showing an example of construction before detection of faulty address of the audio storage device 5, and FIG. 3 is an illustration showing an example of construction after detection of faulty address of the audio storage device 5. In these drawings, the audio storage device 5 has the leading address of 0 to last address of 255. Each address may be expressed by 8 bits and is basically accessible in random manner.

On the other hand, in the audio storage device 5, the faulty storage portion is basically caused per bit and failure caused in the faulty storage portion is sticking of the value at "0" or "1" which value does not change in elapsing of time.

In the faulty address detection, for each address (one word), inspection data of "AAH" ("10101010") and "55H" ("01010101") are written. Immediately after writing of the inspection data, the written data is read out and compared with the inspection data for checking matching or unmatching.

In the faulty address detection, even when faulty storage portion (indicated as "x") is detected even in one bit through the foregoing detecting process, the relevant address is judged as faulty word. Namely, in the audio storage device 5 of FIG. 2, addresses 0, 2, 7, 8, 15, 17 and 29 are found as faulty words.

In the faulty address detecting function, the address of the faulty storage portion in the audio storage device 5 is detected for generating the faulty address table from the leading address of the audio storage device 5 on the basis of the result of detection. In such case, faulty inspection is generally performed per three words so that the audio data will never be stored when at least one of sequential three words is not normal.

Here, the reason why the faulty inspection is performed per three words is that, if there is at least three sequential normal words, the start address value and end address value of the normal region and storage position of the start address of the next normal region can be stored respectively.

In the audio storage device 5 shown in FIG. 2, since the leading address (address 0) is faulty word, the faulty address detecting function avoids the faulty storage portion and write the start address value "03" of the normal region #1 in the address 3, the end address value "03" to the normal region #1 in the address 4, and the storage position of the start address value "09" of the normal region #2 in the address 5.

It should be noted that the end address value is the start address value of the last inspection unit among the sequential normal regions. In this case, since the normal region #1 consists of one inspection unit, the same value as the start address value is written as the end address value.

The inspection unit subsequent to the normal region #1 is the inspection unit beginning from the address 6. Since the addresses 7 and 8 are faulty words, the faulty address detecting function avoids faulty storage portion, the next inspection unit judged as normal, namely, the start address value "09" of the normal region #2 is written in the address 9 and the end address value "12" is written in the address 10 in the normal region #2, the storage position "12" of the start address value of the normal region #3 is written in address 11, the start address value "18" of the normal region #3 is written in the address 12 and the end address value "24" of the normal region #3 is written in the address 13, the storage position "18" of the start address value of the normal region #4 is written in the address 14. In such case, since the normal region #2 is constructed with two inspection units, respective range information of normal regions #2 and #3 are written.

In the inspection unit subsequent to the normal region #2 is the inspection unit beginning from the address 15. Since the addresses 15 and 17 are faulty words, the faulty address detecting function avoids the faulty storage portion. The next inspection unit judged as normal, namely the start address value "30" of the normal region #4 is written in the address 18, the end address value "252" of the normal region #4 is written in the address 19, and "00" indicative of end of the faulty address table is written in the address 20. In this case, since the normal region #3 is consisted of three inspection units, the range information of the normal region #4 and the audio data are written.

As set forth above, the audio storage device 5 shown in FIG. 3 generates the faulty address table in the normal region among the faulty address table region from address 3 to address 20, and stores the audio data in the normal region among audio storage region from address 21 to address 255.

Figure 4:
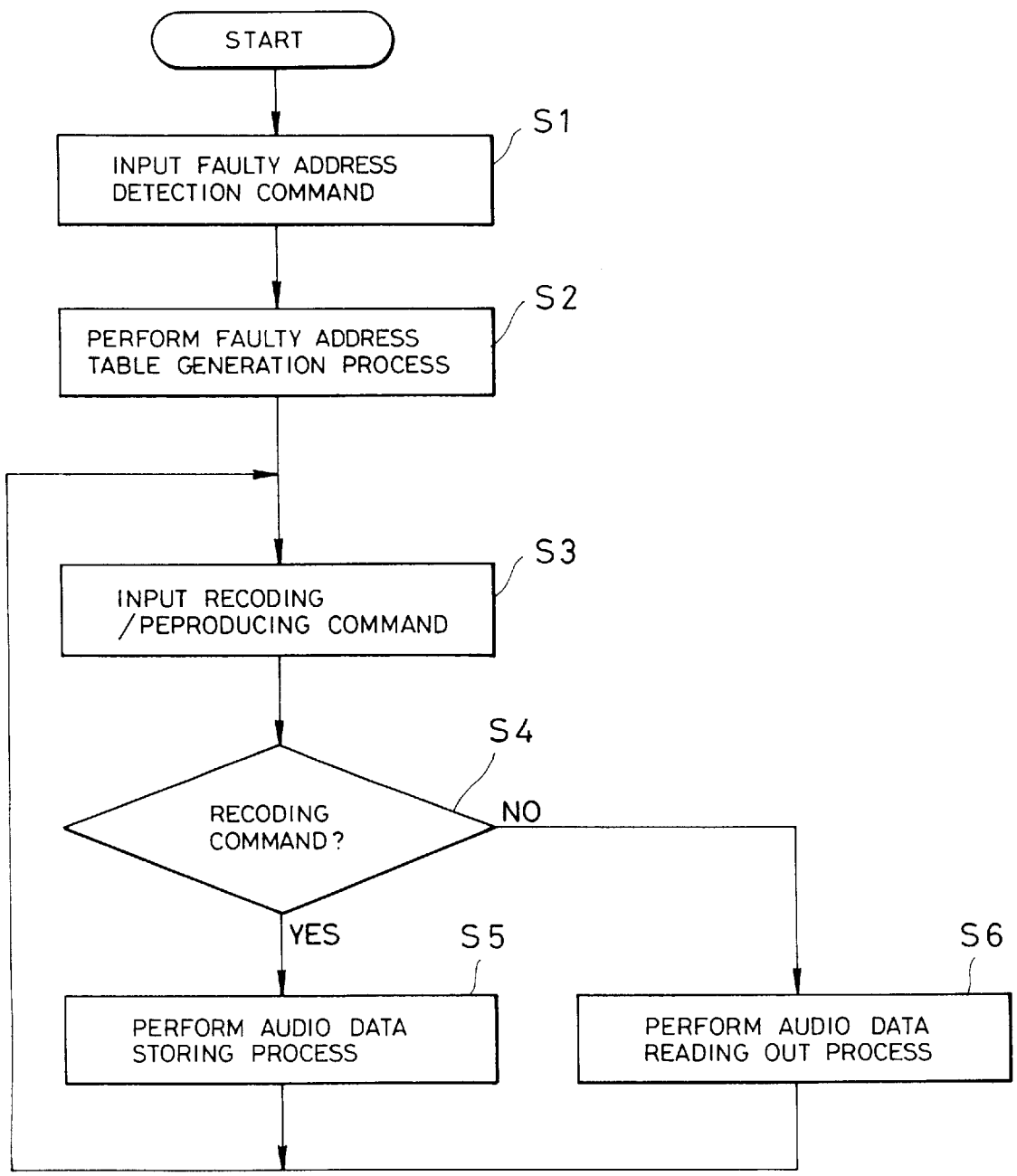
FIG. 4 is a flowchart showing operation of one embodiment of the audio data storage system according to the invention.
Figure 14:
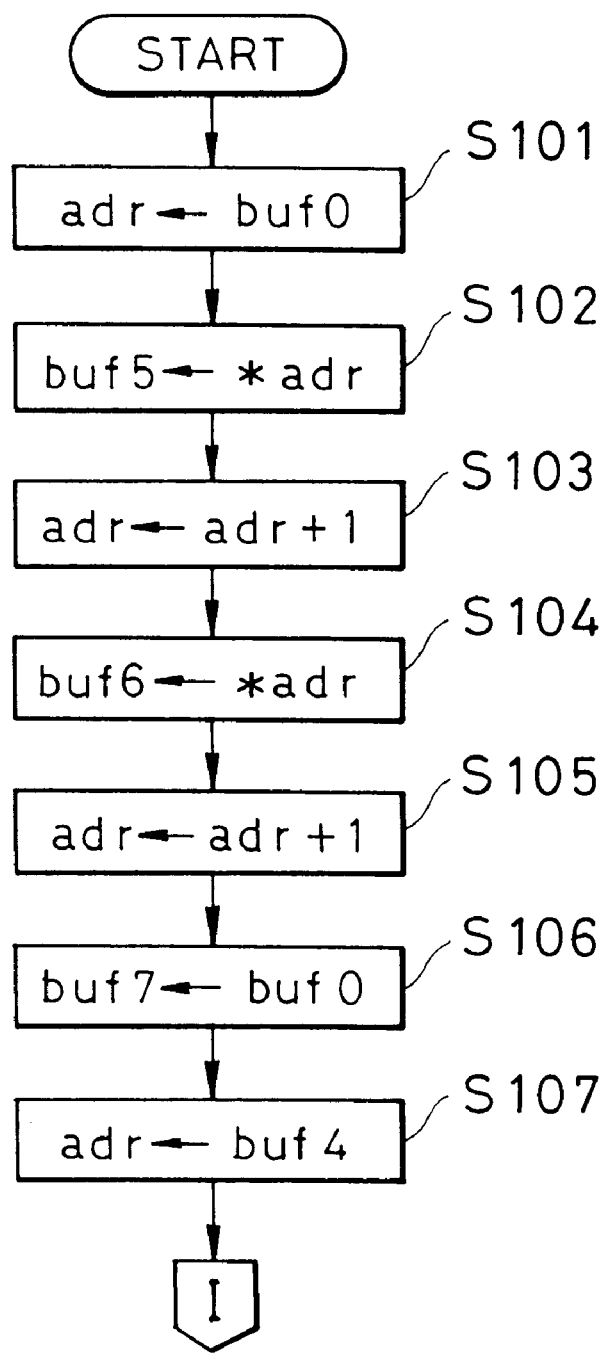
FIG. 14 is a flowchart showing processing procedure of a recording function by one embodiment of the audio data storage system according to the invention.
Figure 15:
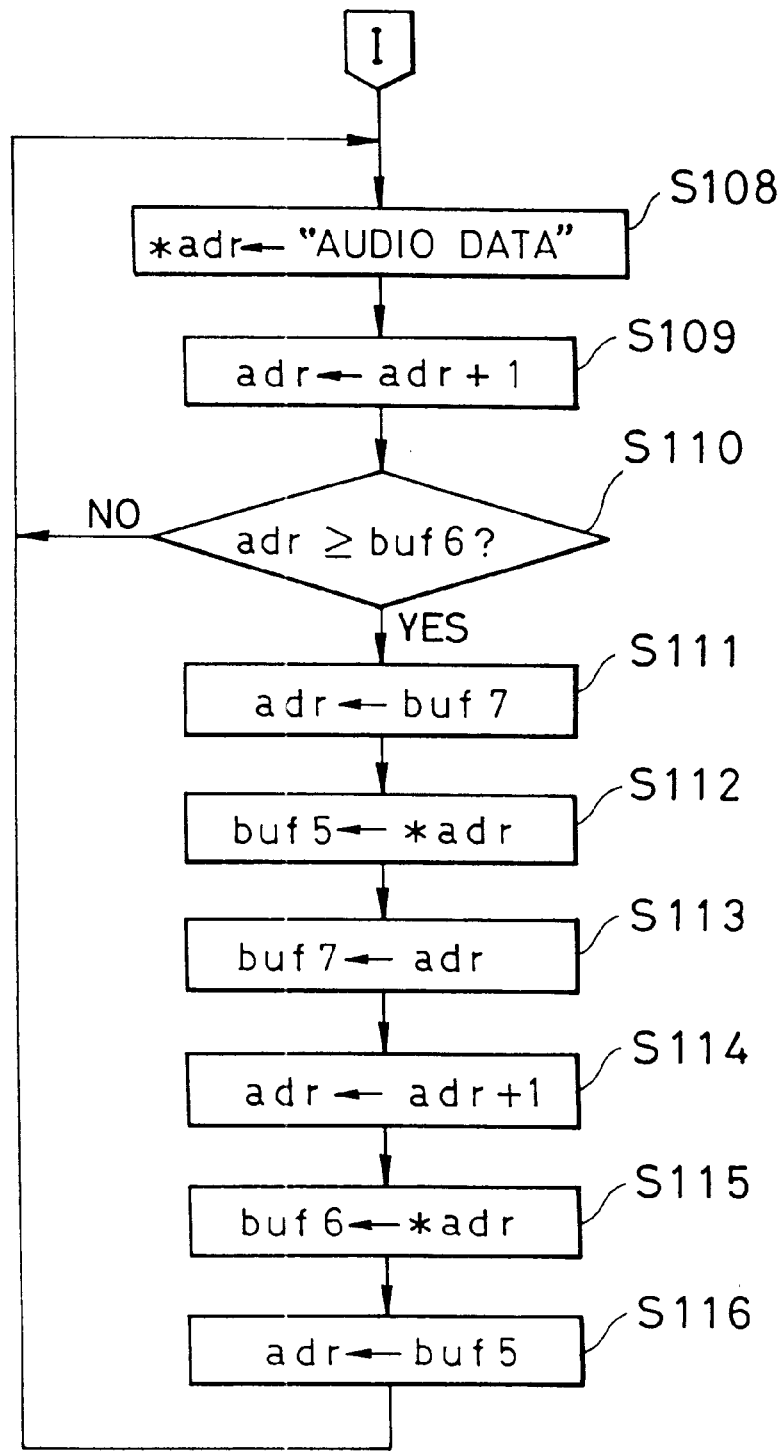
FIG. 15 is a flowchart showing processing procedure of a recording function by one embodiment of the audio data storage system according to the invention.
Figure 16:
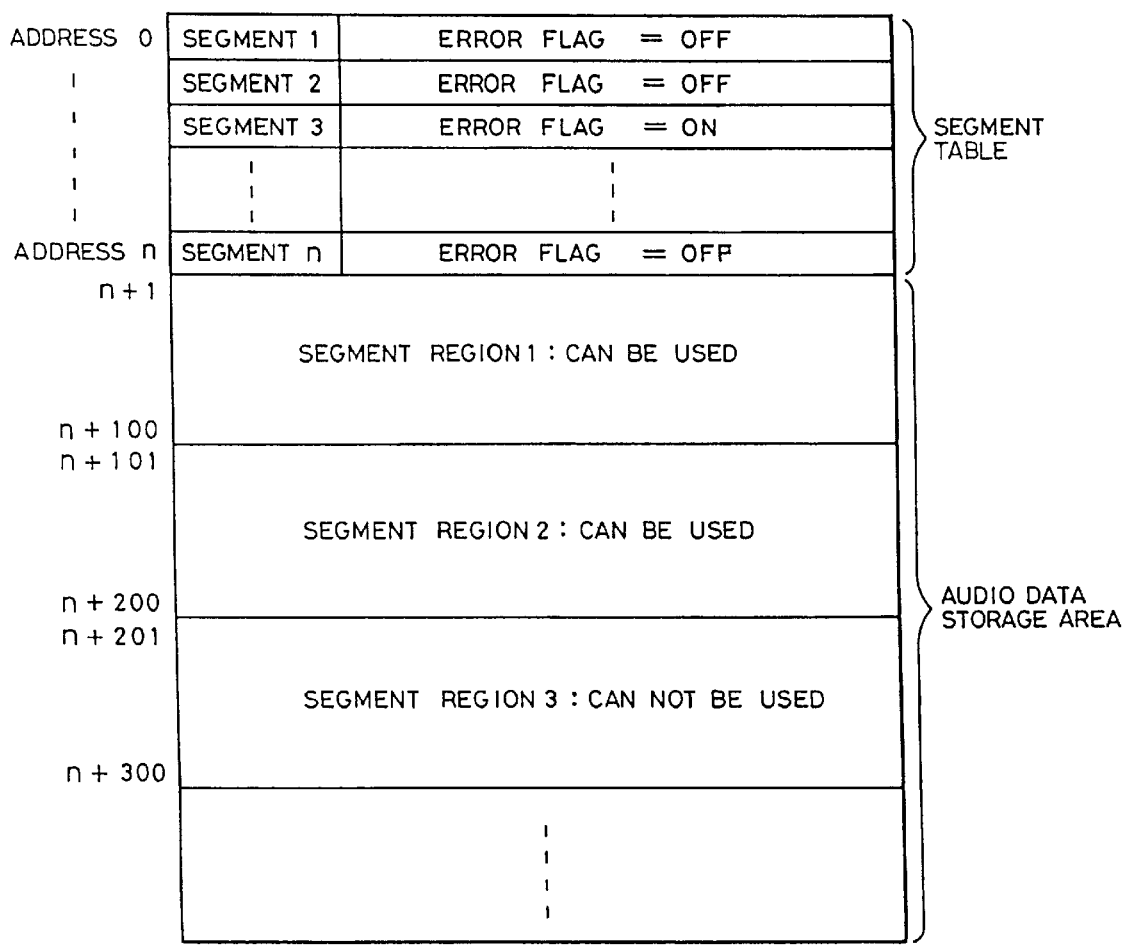
FIG. 16 is an illustration showing an example of construction of the conventional audio data storage system.

FIG. 4 is a flowchart showing operation of one embodiment of the audio data storage system according to the present invention. FIGS. 5 to 13 are flowcharts respectively showing processing procedure of the faulty address detecting function in one embodiment of the audio data storage system according to the invention, and FIGS. 14 and 15 are flowcharts showing processing procedure of the recording function in one embodiment of the audio data storage system according to the invention. Processing procedure of the faulty address detecting function and the recording function of one embodiment of the audio data storage system according to the present invention will be discussed with reference to FIGS. 1 to 15.

When the faulty address detecting command is input from the external host in the digital audio data accumulation device 1 (step S1 of FIG. 4), the faulty address detecting function is activated to perform process for generating the faulty address table (step S2 of FIG. 4).

Subsequently, the digital audio data accumulation device 1 is situated into the waiting state of recording and reproducing command from the external host. When the digital audio data accumulation device 1 is responsive to the recording and reproducing command from the external host (step S3 of FIG. 4), check is performed whether the command from the external host is the recording command (step S4 of FIG. 4).

The digital audio data accumulation device 1 is responds to the recording command from the external host to perform audio data storing process by activating the recording function (step S5 of FIG. 4). On the other hand, when the command from the external host is judged as not the recording command, the digital audio data accumulation device 1 activates the reproducing function to perform reading out process of the audio data (step S6 of FIG. 4).

When the digital audio data accumulation device 1 is activated by the faulty address detecting function, the system control unit 11 sets the address output from the digital audio data accumulation device 1 to the audio storage device 5 (hereinafter referred to as pointer) at the leading address= address 0 (adr←0) (step S11 of FIG. 5).

Subsequently, the system control unit 11 executes faulty inspecting sub-routine per three word unit from the set address [CHECK (adr, err)] (step S12 of FIG. 5). The system control unit 11 returns error flag=0 (OFF) if all of the sequential three words are normal during execution of faulty inspecting sub-routine per three words unit, and returns the error flag=1 (ON) when abnormality is detected in any one of the sequential three words.

Figure 5:
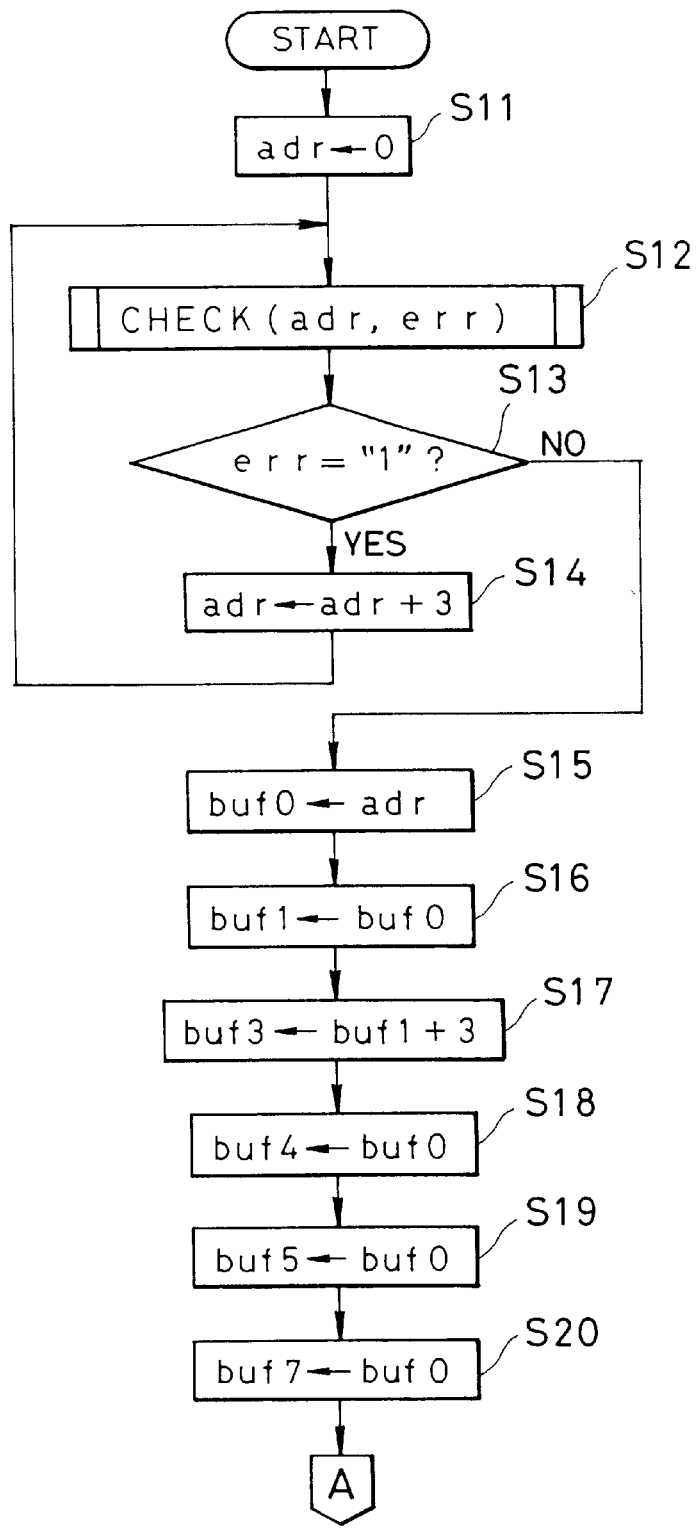
FIG. 5 is a flowchart showing a processing procedure of faulty address detecting function by one embodiment of the audio data storage system according to the invention.

The system control unit 11 judges whether the error flag="1" is returned in execution of the faulty inspecting sub-routine (step S13 of FIG. 5). If judgement is made that error flag="1" is returned, the pointer is set at the address of three address ahead (adr←adr+3) (step S14 of FIG. 5).

On the other hand, when the system control unit 11 makes judgement that the error flag="1" is not returned, namely, when the first normal sequential three words in the audio storage device 5 is detected, the address value of the first detected normal word is stored in the buffer #0 of the storage device 12 for the inspecting operation (buf0←adr) (step S15 of FIG. 5).

Subsequently, the system control unit 11 stores the start address value of the detected sequential normal region in the buffer #1 (buf1←buf0) (step S16 of FIG. 5).

The system control unit 11 stores the address greater than the value of the buffer #1 for three addresses, as address value indicative of the position for writing the start address of the next normal region, in the buffer #3 (buf3←buf1+3) (step S17 of FIG. 5).

On the other hand, the system control unit 11 stores the value of the buffer #0 as address value indicating the position to write in the data of the buffer #1 in the buffer #4 (buf4←buf0) (step S18 of FIG. 5).

Also, the system control unit 11 stores the value of the buffer #0 as start address value of the faulty address table for reference, in order to avoid writing of the faulty word position upon writing in the audio storage device 5 of the buffer #1, in the buffer #5 (buf5←buf0) (step S19 of FIG. 5).

Furthermore, the system control unit 11 stores the valve of the buffer #0 as the address value indicative of the position where data of the buffer #5 is written in the audio storage device 5, in the buffer #7 (buf7←buf0) (step S20 of FIG. 5).

Subsequently, the system control unit 11 executes the faulty inspecting sub-routine of three word unit from the set address [CHECK(adr, err)] (step S21 of FIG. 6). The system control unit 11 executes faulty inspecting sub-routine of the three words unit to return the error flag="0" if all of the sequential three words are normal and to return the error flag="1" when abnormality is detected in any one of the sequential three words.

Figure 6:
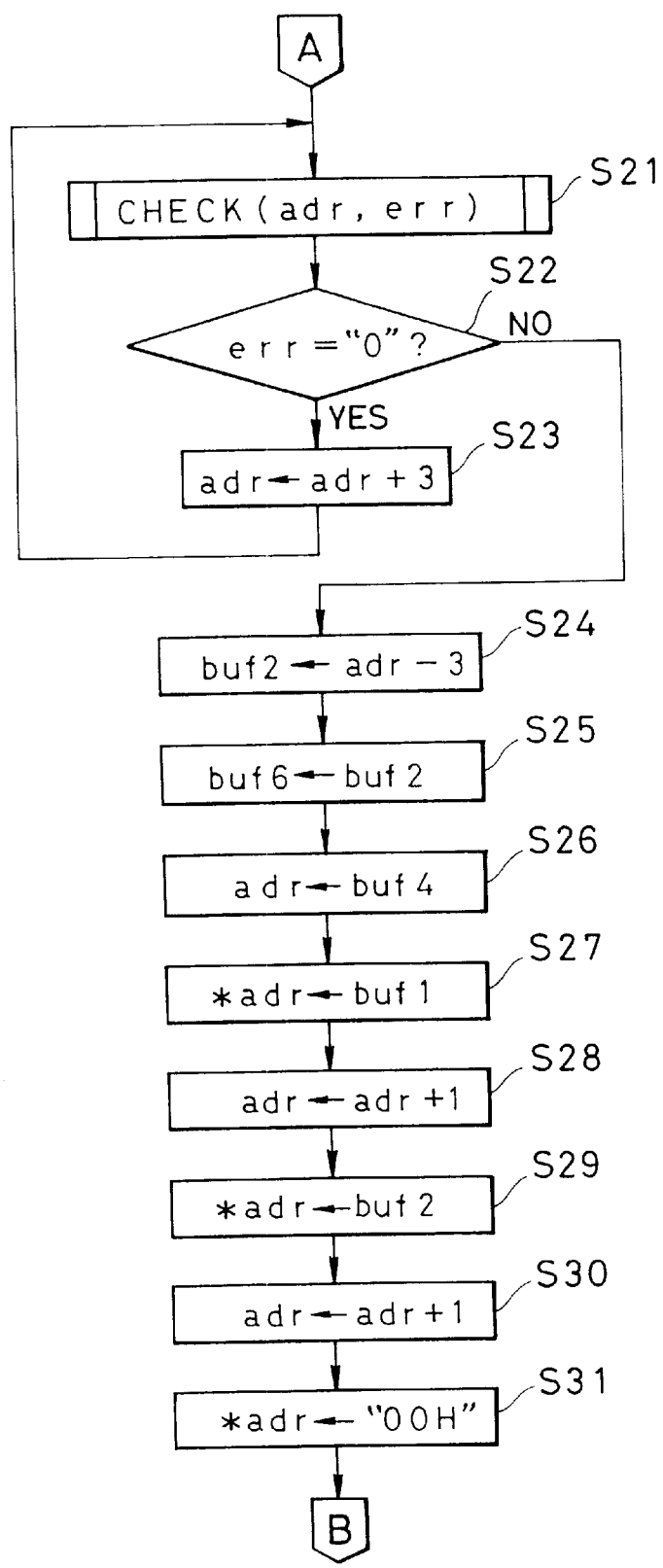
FIG. 6 is a flowchart showing a processing procedure of faulty address detecting function by one embodiment of the audio data storage system according to the invention.

The system control unit 11 checks whether the error flag="0" is returned in execution of the faulty inspecting sub-routine (step S22 of FIG. 6). If judgement is made that the error flag="0" is returned, the address of three address ahead is set to the pointer (adr←adr+3) (step S23 of FIG. 6).

On the other hand, when judgement is made that error flag="0" is not returned, namely, when the end address of the first sequential normal region in the audio storage device 5 is detected, the system control unit 11 stores the end address value of the detected sequential normal region, namely a value derived by subtracting three from the address value of three address ahead, in the buffer #2 (buf2←adr−3) (step S24 of FIG. 6).

Subsequently, the system control unit 11 stores the value of the buffer #2 as end address value of the faulty address table, in the buffer #6 (buf6←buf2) (step S25 of FIG. 6).

Thereafter, the system control unit 11 sets the value of the buffer #4 to the pointer (adr←buf4) (step S26 of FIG. 6). Then, the value of the buffer #1 is written in the storage position (hereinafter referred to as pointer storage position) indicated by the address (*adr←buf1) (step S27 of FIG. 6).

Next, the system control unit 11 sets the value derived by adding one to the address set at step S26 (adr←adr+1) (step S28 of FIG. 6). Then, the value of the buffer #2 is written in the pointer storage position (*adr←buf2) (FIG. 29 of FIG. 6).

Also, the system control unit 11 sets the value derived by adding one to the address set at step S28 to the pointer (adr←adr+1) (step S30 of FIG. 6). Also, an initial value "00H" ("00000000") is written in the pointer storage position (*adr←"00H") (step S31 of FIG. 6).

By the foregoing process, the system control unit 11 detects the normal region which is close to the leading address and sequential for three or more words and generates the faulty address table in the audio storage device 5 (see the normal region #1 of FIG. 3).

Figure 7:
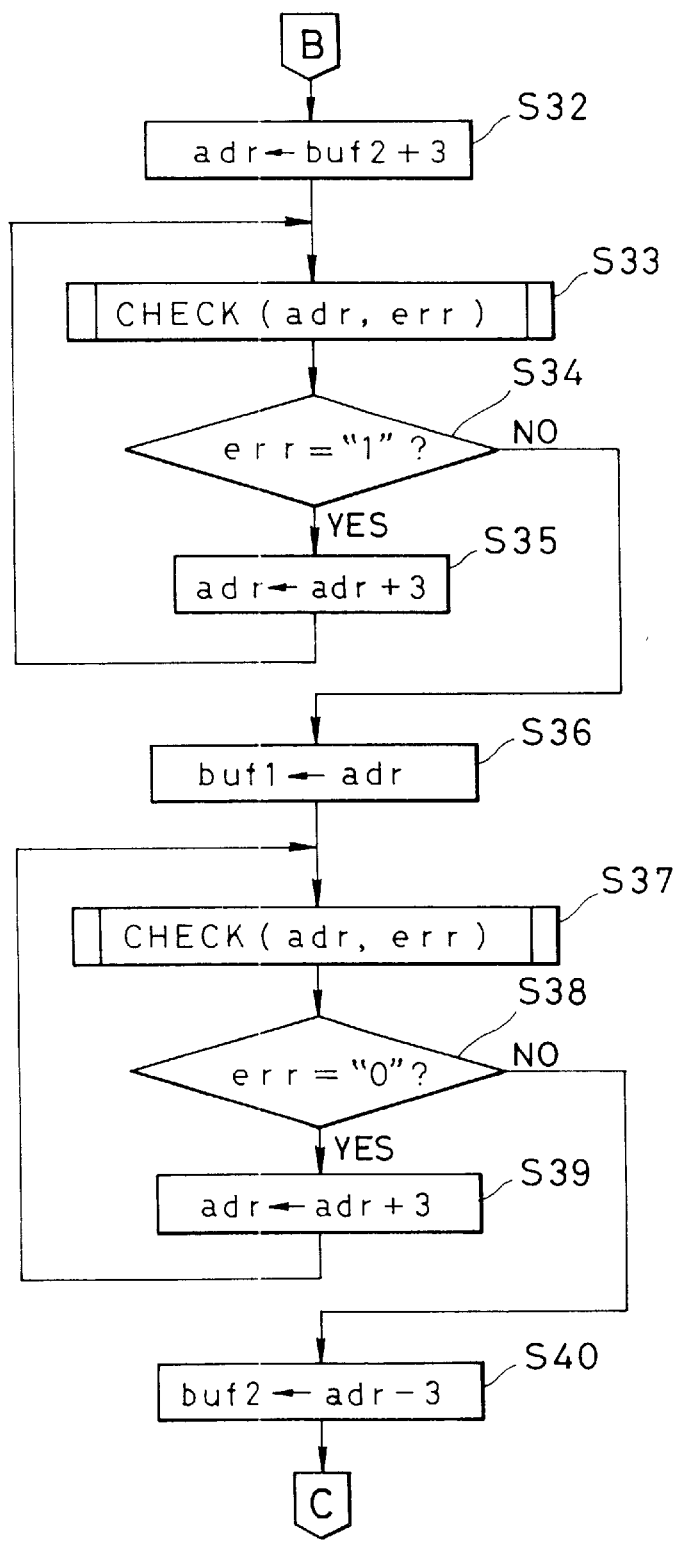
FIG. 7 is a flowchart showing a processing procedure of faulty address detecting function by one embodiment of the audio data storage system according to the invention.

The system control unit 11 sets the address greater than the value of the buffer #2 for three addresses to the pointer (adr←buf2+3) (step S32 of FIG. 7). Subsequently, the system control unit 11 enters into the process for detecting next sequential normal region.

Subsequently, the system control unit 11 executes the faulty inspecting sub-routine per three word unit from the set address [CHECK (adr, err)] (step S33 of FIG. 7). The system control unit 11 returns the error flag="0" if all of the sequential three words are normal in execution of the faulty inspecting sub-routine and returns the error flag="1" when abnormality is detected in any one of the sequence of three words.

The system control unit 11 checks whether the error flag="1" is returned in execution of the faulty inspecting sub-routine (step S34 of FIG. 7). If judgement is made that the error flag="1" is returned, the address of three address ahead is set to the pointer (adr←adr+3) (step S35 of FIG. 7).

On the other hand, when judgement is made that error flag="1" is not returned, namely, when the sequential normal region (three word unit) in the audio storage device 5 is detected, the system control unit 11 stores the address value of the detected normal words in the buffer #1 (buf1←adr) (step S36 of FIG. 7).

Subsequently, the system control unit 11 executes the faulty inspecting sub-routine per three word unit from the set address [CHECK (adr, err)] (step S37 of FIG. 7). The system control unit 11 returns the error flag="0" if all of the sequential three words are normal in execution of the faulty inspecting sub-routine and returns the error flag="1" when abnormality is detected in any one of the sequence of three words.

The system control unit 11 checks whether the error flag="0" is returned in execution of the faulty inspecting sub-routine (step S38 of FIG. 7). If judgement is made that the error flag="0" is returned, the address of three address ahead is set to the pointer (adr←adr+3) (step S39 of FIG. 7).

On the other hand, when judgement is made that error flag="0" is not returned, namely, when the end address of the first sequential normal region in the audio storage device 5 is detected, the system control unit 11 stores the end address value of the detected sequential normal region, namely a value derived by subtracting three from the address value of three address ahead, in the buffer #2 (buf2←adr−3) (step S40 of FIG. 7).

When the process set forth above is completed, the system control unit 11 writes the NEXT table address in one preceding faulty address table and writes the start/end address value of the detected sequential normal region in the faulty address table.

The system control unit 11 compares the value of the buffer #3 and the value of the buffer #6 for checking whether the value of the buffer #3 is greater than the value of the buffer #6. Namely, check is performed whether the address value indicative of the position where the start and end addresses of next one sequential normal region is greater than the end address value of the faulty address table to be made reference to upon writing the faulty address table (buf3>buf6) (step S41 of FIG. 8).

Figure 8:
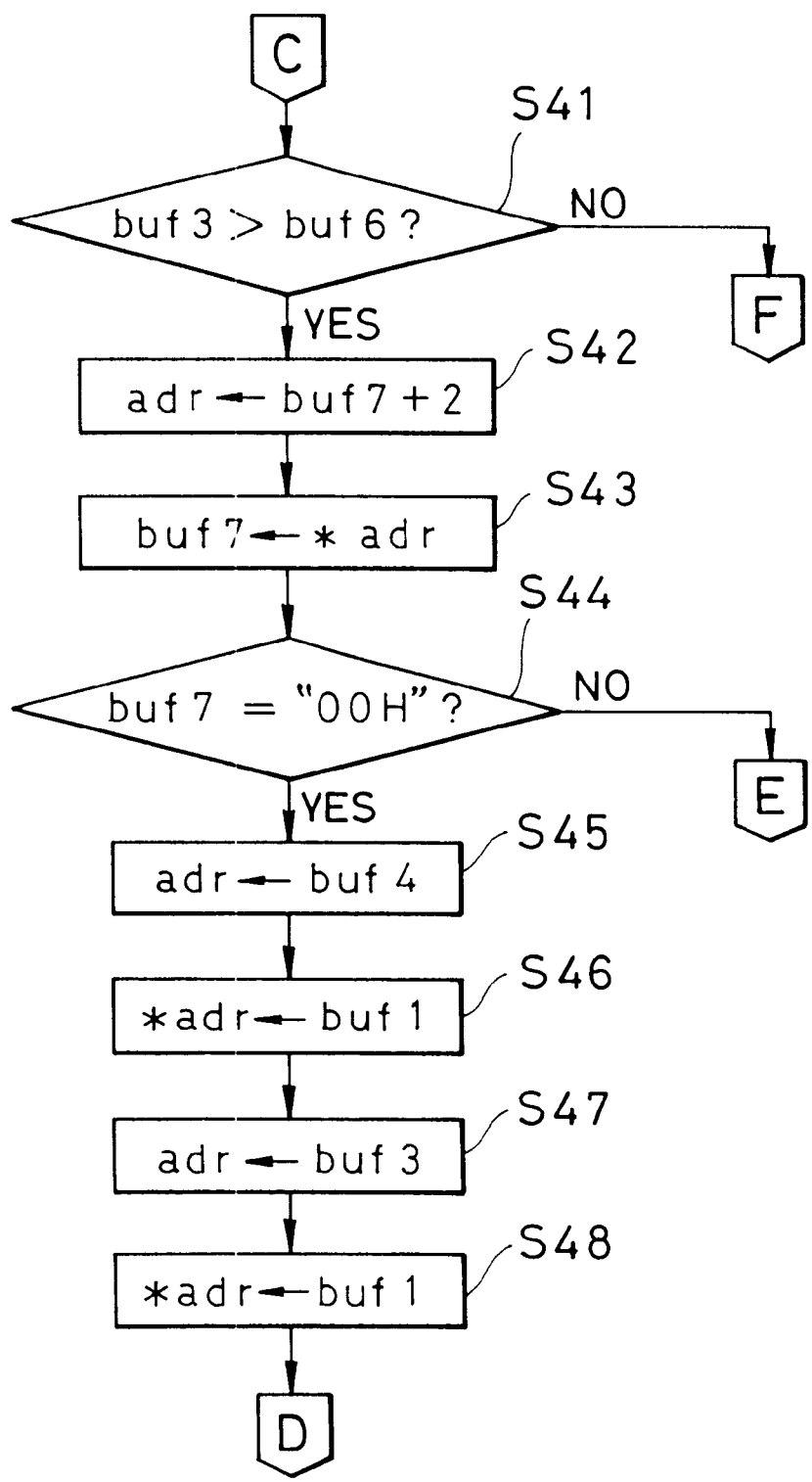
FIG. 8 is a flowchart showing a processing procedure of faulty address detecting function by one embodiment of the audio data storage system according to the invention.

When judgement is made that the value of the buffer #3 is greater than the value of the buffer #6, the system control unit 11 sets a value derived by adding two to the value of the buffer 7 to the pointer (adr←buf7+2) (step S42 of FIG. 8), and the value of the pointer storage position is stored in the buffer #7 (buf7←*adr) (step 43 of FIG. 8).

At this time, the system control unit 11 makes judgement whether the value of the buffer #7 is the initial value "00H" or not (buf7 ="00H") (step S44 of FIG. 8).

When the value of the buffer #7 is judged as the initial value "00H", the system control unit 11 sets the value of the buffer #4 in the pointer (adr←buf4) (step S45 of FIG. 8), and the value of the buffer #1 is written in the pointer storage position of the address value indicative of the NEXT table in the preceding table (*adr←buf1) (step S46 of FIG. 8).

The value of the buffer #3, namely the address value indicative of the NEXT table in the preceding table, is set in the pointer (adr←buf3) (step S47 of FIG. 8). The value of the buffer #1 is written in the pointer storage position (*adr←buf1) (step S48 of FIG. 8).

Figure 9:
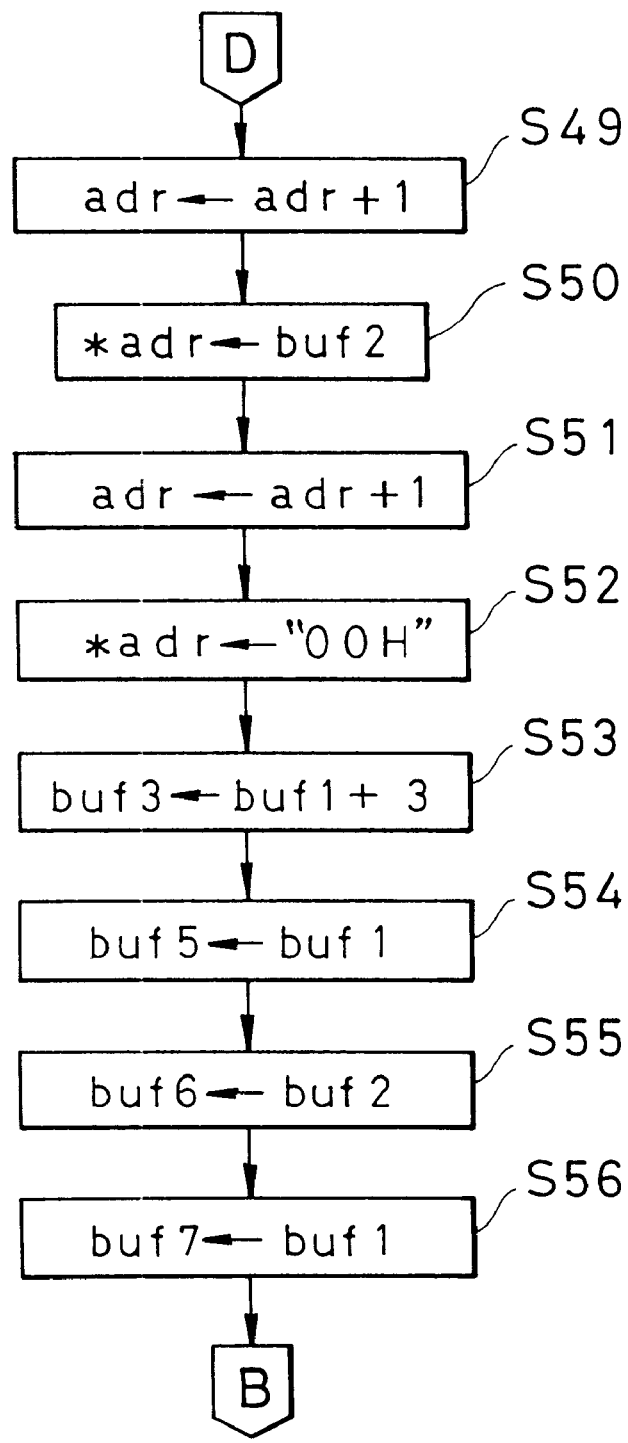
FIG. 9 is a flowchart showing a processing procedure of faulty address detecting function by one embodiment of the audio data storage system according to the invention.

Next, the system control unit 11 sets the value derived by adding one to the address set at step S48 in the pointer (adr←adr+1) (step S49 of FIG. 9). Then, the value of the buffer #2 is written in the pointer storage position (*adr←buf2) (step S50 of FIG. 9).

Also, the system control unit 11 sets the value derived by adding one to the address set at step S49 in the pointer (adr←adr+1) (step S51 of FIG. 9). Also, an initial value "00H" is written in the pointer storage position (*adr←"00H") (step S52 of FIG. 9).

The system control unit 11 stores the address greater than the value of the buffer #1 for three addresses, as address value indicative of the position for writing the NEXT table, in the buffer #3 (buf3←buf1+3) (step S53 of FIG. 9).

On the other hand, the system control unit 11 stores the value of the buffer #1 as start address value of the faulty address table for reference in order to avoid writing to the faulty word position upon writing data of the buffer #1 in the audio storage device 5 (buf5←buf1) (step S54 of FIG. 9).

Furthermore, the system control unit 11 stores the value of the buffer #2 as the end address value of the reference address table in the buffer #6 (buf6←buf2) (step S55 of FIG. 9).

In addition, the system control unit 11 stores the value of the buffer #1 as address value indicative of the position, in which the data of the buffer #5 is written in the audio storage device 5, in the buffer #7 (buf7←buf1) (step S56 of FIG. 9). Subsequently, the system control unit 11 enters into the process for detecting next sequential normal region returning to step S32.

Figure 10:
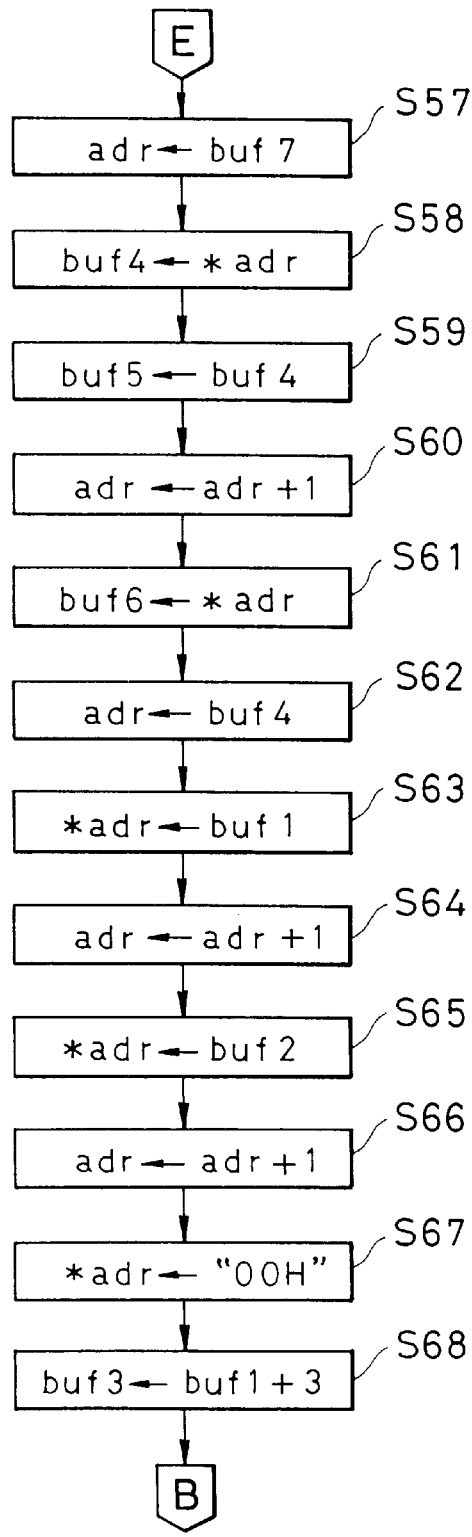
FIG. 10 is a flowchart showing a processing procedure of faulty address detecting function by one embodiment of the audio data storage system according to the invention.

On the other hand, when judgement is made that the value of the buffer #7 is not the initial value "00H", the value of the buffer #7 is set in the pointer (adr←buf7) (step S57 of FIG. 10). The value of the pointer storage position is stored in the buffer #4 (buf4←*adr) (step S58 of FIG. 10).

The system control unit 11 stores the value of the buffer #4 in the buffer #5 (buf5←buf4) (step S59 of FIG. 10). The value derived by adding one to the address set at step S57 is set in the pointer (adr←adr+1) (step S60 of FIG. 10).

On the other hand, the system control unit 11 stores the value of the pointer storage position in the buffer #6 (buf6←*adr) (step S61 of FIG. 10), and the value of the buffer #4 is set in the pointer (ard←buf4) (steps S62 of FIG. 10).

Also, the system control unit 11 write in the value of the buffer #1 in the pointer storage position (*adr←buf1) (step S63 of FIG. 10), and the value derived by adding one to the address set at step S62 in the pointer (adr←adr+1) (step S64 of FIG. 10).

Furthermore, the system control unit 11 writes the value of the buffer #2 in the pointer storage position (*adr←buf2) (step S65 of FIG. 10), and the value derived by adding one to the address set at step S64 in the pointer (adr←adr+1) (step S66 of FIG. 10).

The system control unit 11 write the initial value "00H" in the pointer storage position (*adr←"00H") (step S67 of FIG. 10), and the address of three addresses ahead from the value of the buffer #1 is set in the pointer (buf3←buf1+3) (step S68 of FIG. 10). Next, the process enters into the detection process of subsequent normal region.

Figure 11:
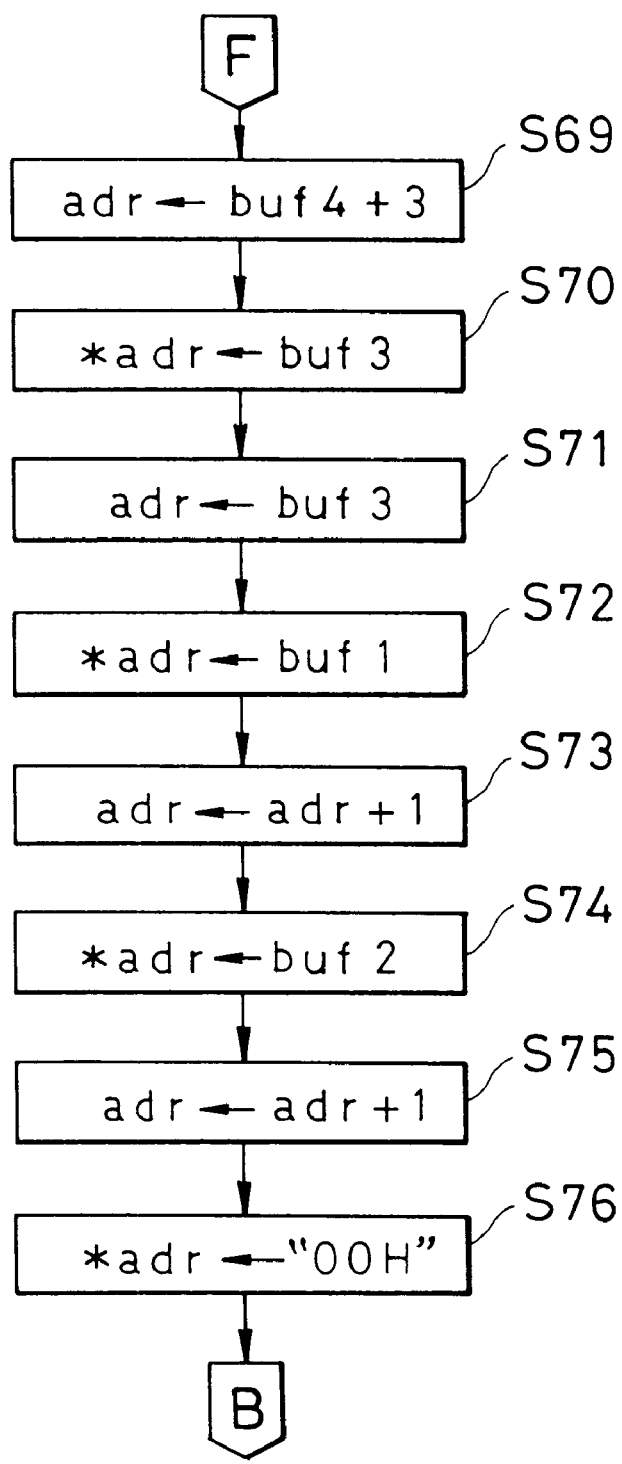
FIG. 11 is a flowchart showing a processing procedure of faulty address detecting function by one embodiment of the audio data storage system according to the invention.

When judgement is made that the value of the buffer #3 is greater than the value of the buffer #6, the system control unit 11 sets the address of three address ahead of the value of the buffer #4 in the pointer (adr←buf4+3) (step S69 of FIG. 11), and the value of the buffer #3 is written in the pointer storage position (*adr←buf3) (step S70 of FIG. 11).

The system control unit 11 sets the value of the buffer #3 in the pointer (adr←buf3) (step S71 of FIG. 11), and the value of the buffer #1 is written in the pointer storage position (*adr←buf1) (step S72 of FIG. 11).

The system control unit 11 sets the value derived by adding one to the address set by the step S71 in the pointer (adr←adr+1) (step S73 of FIG. 11), and the value of the buffer #2 is written in the pointer storage position (*adr←buf2) (step S74 of FIG. 11).

On the other hand, the system control unit 11 sets the value derived by adding one to the address set at step S73 in the pointer (adr←adr+1) (step S75 of FIG. 11) and the initial value "00H" is written in the pointer storage position (*adr←"00H") (step S52 of FIG. 9). Subsequently, the system control unit 11 returns to step S32, and then the process enters into the detecting process for the sequential normal region.

The faulty inspecting sub-routine [CHECK (adr, err)] of three word unit in the faulty address detecting function of the system control unit 11, is executed as set forth above.

Figure 12:
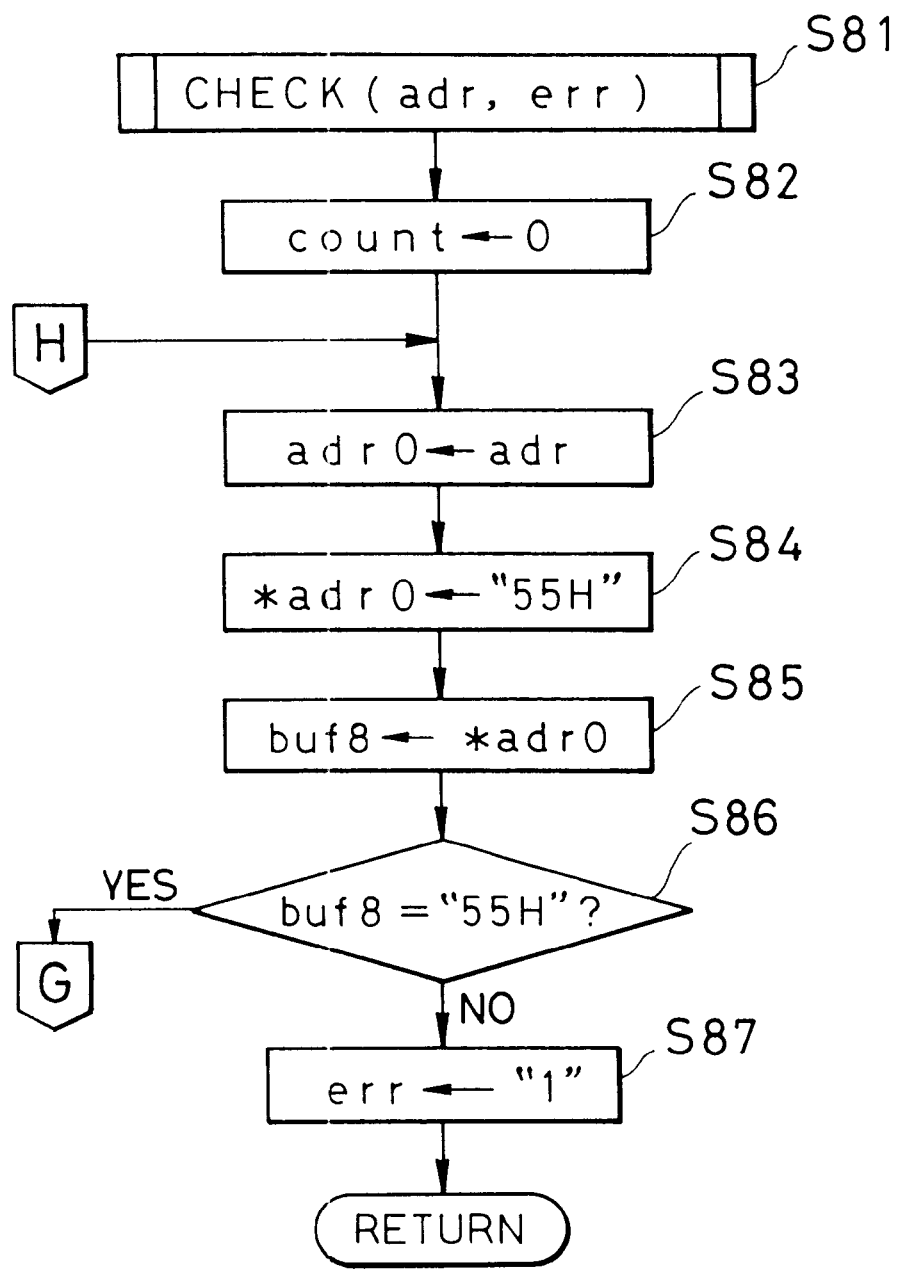
FIG. 12 is a flowchart showing a processing procedure of faulty address detecting function by one embodiment of the audio data storage system according to the invention.

Namely, upon execution of the faulty inspecting sub-routine [CHECK (adr, err)] (step S81 of FIG. 12), the system control unit 11 sets the initial value 0 in the counter of the storage device 12 for inspecting operation (count←0) (step S82 of FIG. 12).

Thereafter, the system control unit 11 stores the pointer in the working address buffer (not shown) for the storage device 12 for inspecting operation (adr0←adr (step S83 of FIG. 12).

The system control unit 11 writes the inspection data "55H" in the address of the audio storage device indicated by the value of the working address buffer (*adr←"55H") (step S84 of FIG. 12), and then data is read from the address of the audio storage device 5 immediately after writing is read out and stored in the buffer #8 (step S85 of FIG. 12).

The system control unit 11 compares the value of the buffer #8 and the inspection data "55H", for making judgement whether they are matched or not (buf8="55H") (step S86 if FIG. 12). When unmatching is judged, the system control device 11 returns the error flag="1" (faulty as a result of inspection) (err←"1") (step S87 of FIG. 12). Then, the process returns to the operation of the faulty address detecting function.

Figure 13:
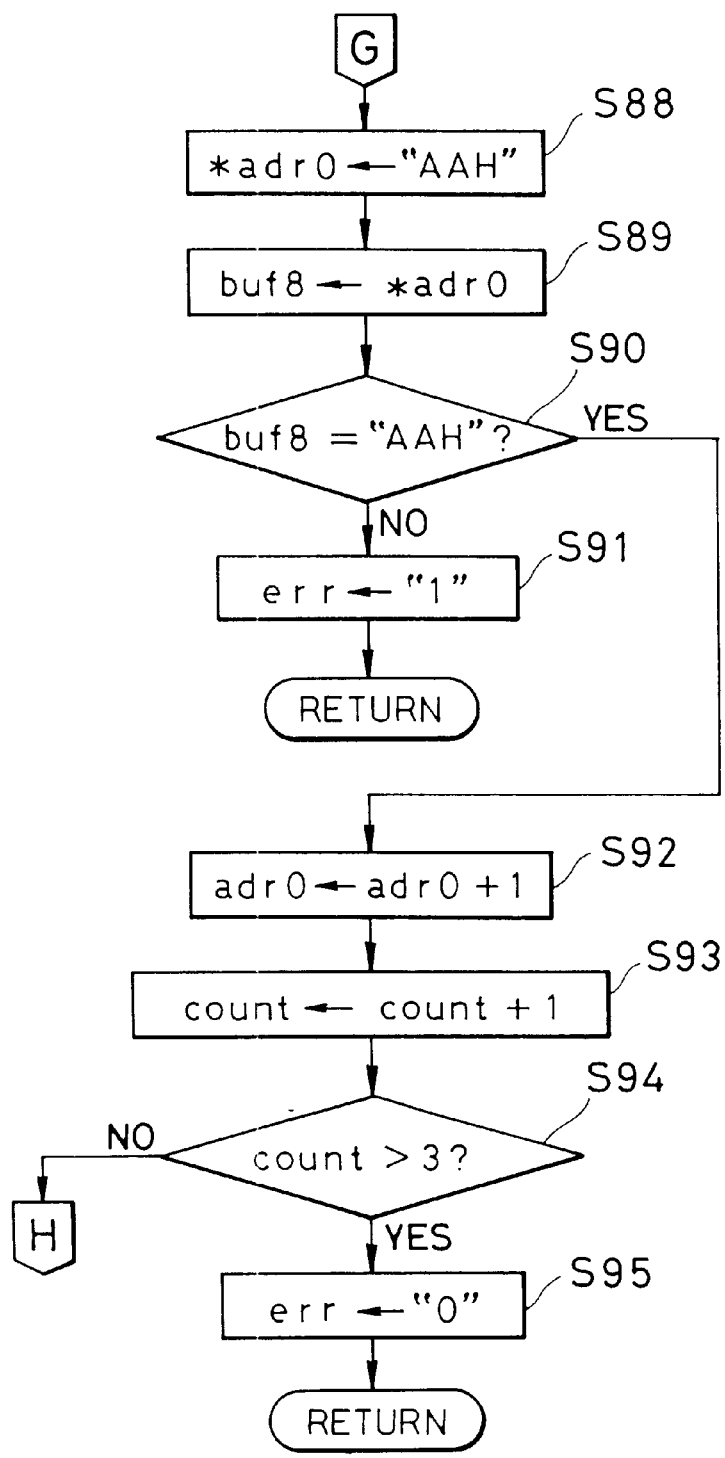
FIG. 13 is a flowchart showing a processing procedure of faulty address detecting function by one embodiment of the audio data storage system according to the invention.

On the other hand, when judgement is made that the value of the buffer #8 and the inspection data "55H" match with each other, the system control device 11 write in the inspection data "AAH" in the address of the audio storage device identified by the value of the working address buffer (*adr0←"AAH") (step S88 of FIG. 13). Then, data is read out from the address of the audio storage device 5 identified by the value of the working storage device immediately after writing the inspection data "AAH" and is stored in the buffer #8 (step 89 of FIG. 13).

The system control unit 11 compares the value of the buffer #8 and the inspection data "AAH", for making judgement whether they are matched or not (buf8="AAH") (step S90 if FIG. 12). When unmatching is judged, the system control device 11 returns the error flag="1" (faulty as a result of inspection) (err←"1") (step S91 of FIG. 12). Then, the process returns to the operation of the faulty address detecting function.

On the other hand, when judgement is made that the value of the buffer #8 and the inspection data "AAH" match with each other, the system control device 11 sets next address value in the working address buffer (step S92 of FIG. 13) and the value derived by adding one to the counter value in the immediately preceding counter value (count←count+1) (step S93 of FIG. 13).

The system control unit 11 then makes judgement whether the added counter value is less than or equal to three (step S94 of FIG. 13). When judgement is made that the counter value is less than or equal to three, the system control unit 11 returns the error flag "0" (the result of inspection is normal) (err←"0") (step 95 of FIG. 13) and the process is returned to the faulty address detecting function. On the other hand, when judgement is made that the counter value as incremented by one is not less than or equal to three, the system control unit 11 continues process with returning step S83.

In the system control unit 11, the recording function is performed in the following manner. At first, the system control unit 11 sets the address value of the buffer #0 in the pointer (adr←buf0) (step S101 of FIG. 14). Then, the data of the pointer storage position is set in the buffer #5 (buf5←*adr) (step S102 of FIG. 14).

The system control unit sets a value derived by adding one to the address set at step S101 in the pointer (adr←adr+1) (step S103 of FIG. 14). Thereafter, the data of the pointer storage position is set in the buffer #6 (buf6←*adr) (step S104 of FIG. 14).

The system control unit 11 sets a value derived by adding one to the address set at step S103 in the pointer (adr←adr+1) (step S105 of FIG. 14).

The system control unit 11 stores value of the buffer #0 in the buffer #7 as the address indicative of the position of the faulty address table (buf7←buf0) (step S106 of FIG. 14).

The system control unit sets the value of the buffer #4, namely the address indicative of the trailing end position of the faulty address table in the pointer (adr←buf4) (step S107 of FIG. 14).

Subsequently, the system control unit 11 write the "audio data" in the pointer storage position (*adr←"audio data") (step S108 of FIG. 15). Then, the address to write in the "audio data" is incremented (adr←adr+1) (step S109 of FIG. 15).

Thereafter, the system control unit 11 makes judgement whether the incremented address is greater than or equal to the value of the buffer #6 or not (adr≧buf6) (step S110 of FIG. 15). If the incremented address is not greater than or equal to the value of the buffer #6, the system control unit 11 performs writing of the "audio data" with returning to step S108.

On the other hand, the system control unit 11 sets the value of the buffer #7 in the pointer when the incremented address is greater than or equal to the value of the buffer #6 (adr←buf7) (step S111 of FIG. 15).

The system control unit 11 stores the value of the pointer storage position in the buffer #5 (buf5←*adr) (step S112 of FIG. 15), and the value of the pointer is stored in the buffer #7 (buf7←adr)(step S113 of FIG. 15).

The system control unit 11 increments the address stored in the buffer #7 (adr←adr+1) (step S114 of FIG. 15), and the value of the pointer storage position is stored in the buffer #6 (adr6←*adr) (step S115 of FIG. 15).

Subsequently, the system sets the value of the buffer #5 in the pointer (adr←buf5) (step S116 of FIG. 15), and then performs writing of the "audio data" with returning the process to step S108.

The foregoing process operation is the operation of the recording mode in the system control unit 11. The operation of the reproducing function in the system control unit 11 is the same process as the above except for the writing process of the "audio data" in step 108 and subsequent steps replaced with the reading out of the "audio data".

As set forth above, by the system control unit 11, the faulty storage portion within the audio storage device 5 is detected sequentially from the leading address, the range information of the normal regions other than the detected faulty storage portion is written sequentially as the faulty address table in the normal region in the audio storage device 5, the audio data is stored in the audio storage device 5 while avoiding the faulty storage portion by making reference to the faulty address table, and the audio data is read out from the audio storage device 5 while avoiding the faulty storage portion by making reference to the faulty address table. Thus, even when the audio storage portion has the faulty word beginning from the leading address, storage of the audio data is enabled. Therefore, the audio storage device as the semiconductor product having the faulty word beginning from the leading address, which is not applicable in the conventional digital audio data accumulating device, can be used. As a result, the audio storage device of the faulty semiconductor product can be supplied as the device for the consumer market in large amount.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments within a scope encompassed and equivalents thereof with respect to the feature set out in the appended claims.

What is claimed is:

1. An audio data accumulating device comprising:
    an audio data storage;
    a detector which sequentially detects faulty storage regions in said audio data storage beginning from a leading address of said audio data storage; and
    a table generator which writes normal region range information indicative of a range of normal region other than the faulty storage regions detected by said detector, in a part of said normal region of said audio data storage as a faulty address table;
    wherein said detector detects said faulty storage regions including end addresses thereof;
    whereby said audio data can be written in said audio data storage while avoiding said faulty storage region by making reference to said faulty address table.

2. An audio data accumulating device as set forth in claim 1, wherein the audio data is read from said audio data storage while avoiding said faulty storage regions by making reference to said faulty address table.

3. An audio data accumulating device as set forth in claim 2, wherein said detector sequentially checks respective detecting regions, each of said detecting regions including a predetermined detection unit, from the leading address within said audio data storage, for detecting whether the detecting region is faulty or not.

4. An audio data accumulating device as set forth in claim 3, wherein said detection unit consists of a plurality of words.

5. An audio data accumulating device as set forth in claim 4, wherein said detector writes a predetermined reference word pattern sequentially from a leading word; sequentially reads out the written word pattern from said leading word after writing; and compares between read out word pattern and said reference word pattern for detecting said faulty storage regions according to a result of comparison.

6. An audio data accumulating device as set forth in claim 5, wherein the detecting region is judged as faulty when failure is detected in at least one word among the plurality of words of said detection unit.

7. An audio data accumulating device as set forth in claim 1, wherein said table generator sequentially writes a start address value and an end address value of said normal region, and if said accumulating device detects another normal region, sequentially writes a storage position of a start address value of said another normal region, said start address value of said another normal region and an end address value of said normal region, and when said accumulating device detects sequentially last normal region in said audio data storage, sequentially writes a start address value and an end address value of said last normal region, and an information indicative of an end of said faulty address table.

8. An audio data accumulating device as set forth in claim 7, wherein said audio data storage comprises a faulty address table portion in which said faulty address table is stored and an audio data storage portion in which said audio data is stored, and wherein a storage position of said information indicative of said end of said faulty address table indicates a boundary between said faulty address table portion and said audio data storage portion.

9. An audio data accumulating device which writes said audio data in an audio data storage with compression; and reproduces the stored audio data by reading out from said audio data storage, wherein said audio data storage comprises a data storage region, for storing said audio data, and a pointer region, for storing a faulty storage region pointer said pointer being indicative of a faulty portion of said audio data storage region and indicative of an end address of said faulty portion; and wherein said audio data is written in said audio data storage while avoiding said faulty portion by making reference to said pointer region.

10. An audio data accumulation device as set forth in claim 9, wherein said audio data is read out from said audio data storage while avoiding said faulty portion by making reference to said pointer region.

11. An audio data accumulation device as set forth in claim 10, wherein a unit region of said faulty portion is a plurality of words of said audio data.

12. An audio data accumulation device as set forth in claim 11, wherein said unit region is judged as faulty when failure is caused in at least one word of said plurality of words constituting the unit region.

13. A data storage system comprising:

a data storage;

a detector which sequentially detects faulty storage regions in said data storage beginning from a leading address of said data storage; and a table generator which writes normal region range information indicative of a range of normal region other than the faulty storage regions detected by said detector, in a part of said normal region of said audio data storage as a faulty address table;

wherein said detector detects said faulty storage regions including end addresses thereof;

whereby said data can be written in said data storage while avoiding said faulty storage region by making reference to said faulty address table.

14. A data accumulating device which writes data in a data storage with compression; and reproduces the stored data by reading out from said data storage, wherein said data storage comprises a data storage region, for storing said data, and a pointer region, for storing a faulty storage region pointer, said pointer being indicative of a faulty portion of said data storage region and indicative of an end address of said faulty portion; and wherein said data is written in said data storage while avoiding said faulty portion by making reference to said pointer region.

* * * * *